United States Patent
Korn et al.

[11] Patent Number: 6,137,938
[45] Date of Patent: Oct. 24, 2000

[54] FLAT TOP, DOUBLE-ANGLED, WEDGE-SHAPED FIBER ENDFACE

[75] Inventors: Jeffrey Korn, Lexington; Steven D. Conover, Chelmsford; Wayne F. Sharfin, Lexington; Thomas C. Yang, North Chelmsford, all of Mass.

[73] Assignee: Lasertron, Inc., Bedford, Mass.

[21] Appl. No.: 08/965,798

[22] Filed: Nov. 7, 1997

Related U.S. Application Data

[60] Provisional application No. 60/048,573, Jun. 4, 1997.

[51] Int. Cl.$^7$ ........................................... G02B 6/02
[52] U.S. Cl. ........................ 385/123; 385/33; 385/43
[58] Field of Search .......................... 385/39, 123, 147, 385/38, 33, 43; 65/2

[56] References Cited

U.S. PATENT DOCUMENTS

| | | | |
|---|---|---|---|
| 4,490,020 | 12/1984 | Sakaguchi et al. | 350/96.18 |
| 4,671,609 | 6/1987 | Khoe et al. | 385/33 |
| 4,698,084 | 10/1987 | Severijns et al. | 65/3.11 |
| 4,701,011 | 10/1987 | Emkey et al. | 350/96.18 |
| 4,726,641 | 2/1988 | Mori | 385/39 |
| 4,766,705 | 8/1988 | Dholakia | 51/328 |
| 4,818,263 | 4/1989 | Mitch | 65/2 |
| 4,839,993 | 6/1989 | Masuko et al. | 51/129 |
| 5,011,254 | 4/1991 | Edwards et al. | 350/96.18 |
| 5,037,174 | 8/1991 | Thompson | 385/33 |
| 5,202,948 | 4/1993 | Suhara et al. | 385/131 |
| 5,256,851 | 10/1993 | Presby | 219/121.69 |
| 5,293,438 | 3/1994 | Konno et al. | 385/35 |
| 5,413,941 | 5/1995 | Koos et al. | 437/8 |
| 5,434,940 | 7/1995 | Roff et al. | 385/91 |
| 5,455,879 | 10/1995 | Modavis et al. | 385/33 |
| 5,526,452 | 6/1996 | Dannoux et al. | 385/39 |
| 5,638,471 | 6/1997 | Semo et al. | 385/33 |
| 5,812,718 | 9/1998 | Carpenter et al. | 385/97 |

FOREIGN PATENT DOCUMENTS

| | | | |
|---|---|---|---|
| 0 086 155 | 8/1983 | European Pat. Off. | B24B 19/00 |
| 54-019762 | 2/1979 | Japan | G02B 5/14 |
| WO 97/42533 | 11/1997 | WIPO | G02B 6/26 |

OTHER PUBLICATIONS

Shah, Virenda S., et al., "Efficient Power Coupling from a 980–nm, Broad–Area Laser to a Single–Mode Fiber Using a Wedge–Shaped Fiber Endface," *Journal of Lightwave Technology IEEE*, vol. 8, No. 9, Sep. 1990, pp. 1313–1318 (1990).

*Primary Examiner*—Brian Healy
*Assistant Examiner*—Ellen Kim
*Attorney, Agent, or Firm*—Hamilton, Brook, Smith & Reynolds, P.C.

[57] ABSTRACT

An improved fiber endface shape for increasing coupling of optical power from a source into fiber and its manufacture are disclosed. The inventive tip comprises a cleaved end surface that is preferably substantially orthogonal to the fiber's axis and a first and second polished, angled surfaces intersecting the end surface. Break-lines between the angled surfaces and the end surface fall near an edge of a cladding-core interface and preferably outside that interface when the fiber and transmitted light are such that a substantial portion of the light is transmitted in the cladding. A spatial intensity profile of light exiting from the tip is detected during manufacture and is used to monitor the polishing of the angled surfaces. Tests have shown that the inventive tip achieves the coupling efficiency associated with the double-angled wedge-shaped fiber tips while maintaining much of the ease of manufacture associated with the single-angle wedge tips.

11 Claims, 3 Drawing Sheets

FLAT TOP, DOUBLE-ANGLED, WEDGE-SHAPED FIBER ENDFACE

RELATED APPLICATION

This application claims priority to U.S. provisional application No. 60/048,573, filed Jun. 4, 1997, the entire teachings of which are incorporated herein by reference.

BACKGROUND OF THE INVENTION

In optical fiber communication systems, and optical fiber light transmission systems generally, it is typically important to increase the efficiency with which light from a source is coupled into the fiber. One of the most common applications is in communications systems to couple light from a single-transverse-mode light source, e.g., semiconductor laser, into a single-mode optical fiber. Historically, there has been a trade-off between high coupling efficiency and ease of manufacture. The following examples illustrate this principle:

1. Bulk optics

This is a popular technique in which lens are used to focus the light from the semiconductor laser onto the endface facet of the fiber. It can provide high-coupling efficiency if adequate lenses are used. The fact that multiple components, typically 1 or 2 lenses, are needed greatly increases the complexity of implementation and the reliability risk, however.

2. Hyperbolic fiber endfaces

The technique has provided coupling of 99% of the power from a single-mode laser into a single-mode fiber by using a high-power infrared laser to machine a hyperbolic surface on the fiber endface or tip. A hyperbola is the ideal shape for fiber coupling. Unfortunately, it is extremely difficult to accurately manufacture these fiber tips with sufficient yield that would warrant implementation in large-scale manufacturing of fiber-coupled single-mode laser modules.

3. Single-angle wedge-shaped fiber endfaces

This has been used to couple 980 nanometer pump lasers to single-mode fibers. While it has the positive feature of being easy to manufacture, the achievable coupling efficiency has been limited to between 65 and 70%.

4. Double-angled wedge-shaped fiber tips

This technique is a compromise between hyperbolic fiber endfaces and the single-angle wedge-shaped fiber endfaces described above. It provides higher coupling efficiency than single-angle wedge-shaped endfaces, but not as high as hyperbolic endfaces. It is significantly easier to manufacture and implement than hyperbolic endfaces, but not as easy as single-angle wedge-shaped fiber endfaces. To completely specify and manufacture the double-angled wedged-shaped fiber tip, four independent angles, having one of only two different values, and the location of three lines of intersection must be fabricated with sufficient precision.

SUMMARY OF THE INVENTION

The present invention is directed to an improved fiber endface shape and its manufacturing process. It achieves the coupling efficiency associated with the double-angled wedge-shaped fiber tips while maintaining the ease of manufacture associated with the single-angle wedge tips.

In general, according to one aspect, the invention relates to optical fibers, which include a core and surrounding cladding for transmitting electromagnetic radiation, and specifically the tips or endfaces that usually receive input radiation from a light source. The inventive tip comprises an end surface that is preferably substantially orthogonal to the axis, a first angled surface intersecting the end surface, and a second angled surface also intersecting the end surface.

In the preferred embodiment, break-lines between the angled surfaces and the end surface fall near an edge of a cladding-core interface and preferably outside that interface when the fiber and transmitted light are such that a substantial portion of the light is transmitted in the cladding.

In other embodiments, break-lines are substantially parallel to each other, with the first and second surfaces being opposed to each other on opposite sides of the fiber.

In still other embodiments, additional angled surfaces are added. In each case, the angled surfaces intersect the end surface at break-lines, preferably falling near the cladding-core interface.

In general, according to another aspect, the invention also relates to a method for manufacturing a tip for an optical fiber. This process comprises first cleaving an end surface in the fiber. At least first and second surfaces are then formed, angled relative to the end surface.

In the preferred embodiment, a spatial intensity profile of light exiting from the tip is detected, which is used to monitor the polishing of the first and/or second angled surfaces.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENT

Figure 1:
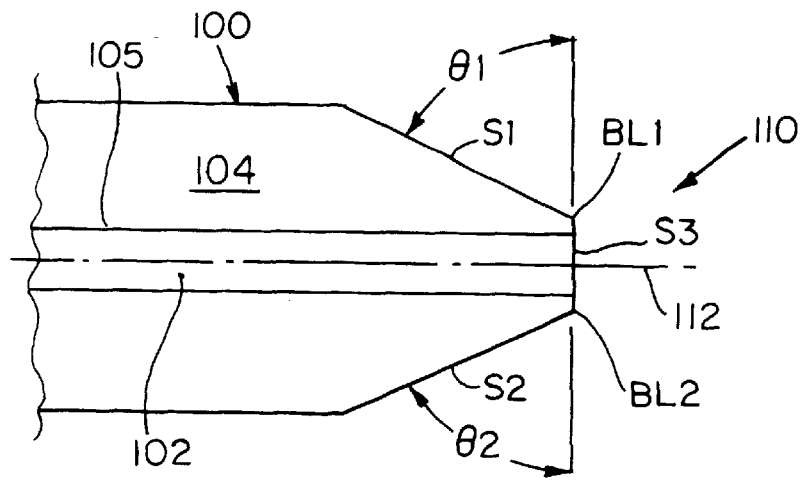
FIG. 1 is a cross-sectional side view of the inventive fiber tip.

FIG. 1 is a cross-sectional view showing a fiber tip or endface constructed according to the principles of the present invention.

The single-mode optical fiber 100 has three surfaces fabricated on tip 110. Planar surfaces S1 and S2 slant obliquely backward from the terminal end, on opposed sides of the fiber. The slopes of surfaces S1 and S2 are identified as $\theta 1$ and $\theta 2$, respectively, measured from a plane extending perpendicularly to the mechanical and optical axis 112 of the fiber 100. Preferably, $\theta 1$ and $\theta 2$ are approximately 25°. A workable range for θ1 and θ2 is between 10 and 40°. In one implementation, one of θ1 or θ2 is more 25° and the other is less 25°. The third surface S3 is perpendicular to the mechanical and optical axis 112 of the fiber 100.

Figure 2:
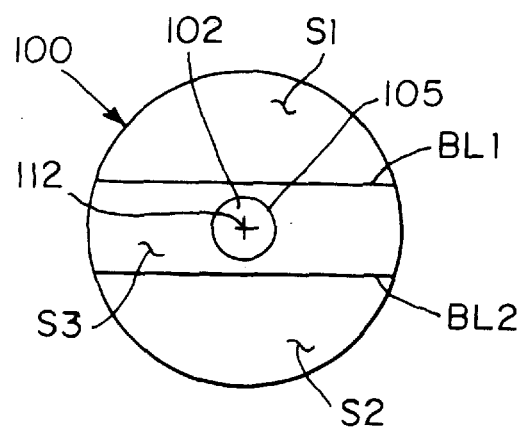
FIG. 2 is an end view of the inventive fiber tip.

As best shown in FIG. 2, the angled surfaces S1 and S2 join the end surface S3 at break-lines BL1 and BL2, respectively. These break-lines pass near the edge of the fiber's core 102, or cladding-core interface, 105.

In the illustrated embodiment, the angled surfaces S1–S2 oppose each other on opposite sides of the fiber 100, and thus the break-lines BL1 and BL2 are parallel to each other. It should be noted that the break-lines BL1 and BL2 need not be parallel to each other for all applications. It may be desirable in some cases to configure the angled surfaces S1 and S2 to not be directly opposed to each other.

Moreover, it is not necessary that the break-lines BL1–BL2 intersect or pass over the core 102 of the fiber 100. In the illustrated example, the break-lines BL1 and BL2 pass to the outside of cladding-core interface 105. This configuration is typically used when the fiber mode's wavelength is sufficiently longer than the cut-off wavelength; a significant portion of the mode will thus occupy the cladding region 104.

Figure 2A:
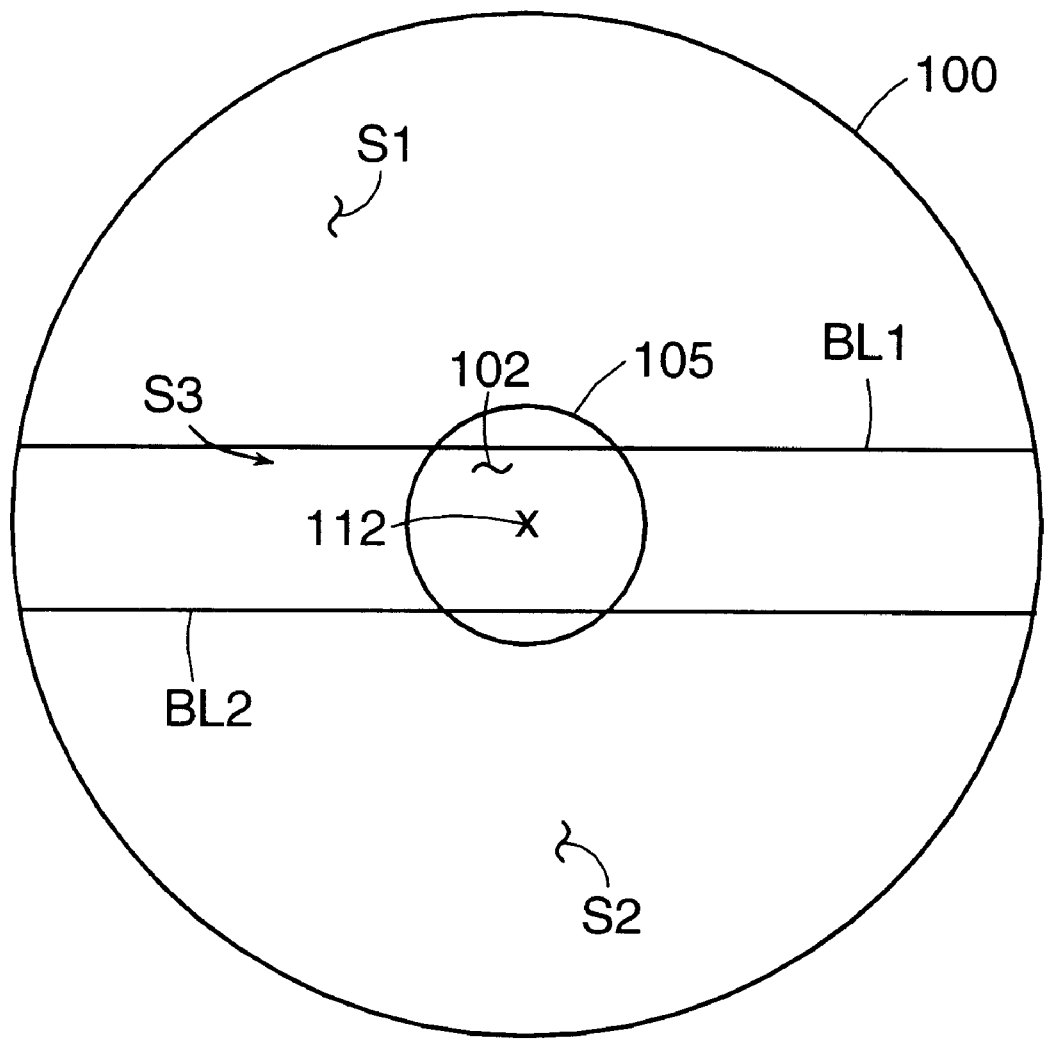
FIG. 2A is an end view of the inventive fiber tip showing the first and second break-lines passing over the core.

FIG. 2A shows another embodiment in which the first and second break-lines pass BL1 and BL2 pass over the core 102.

Figure 3:
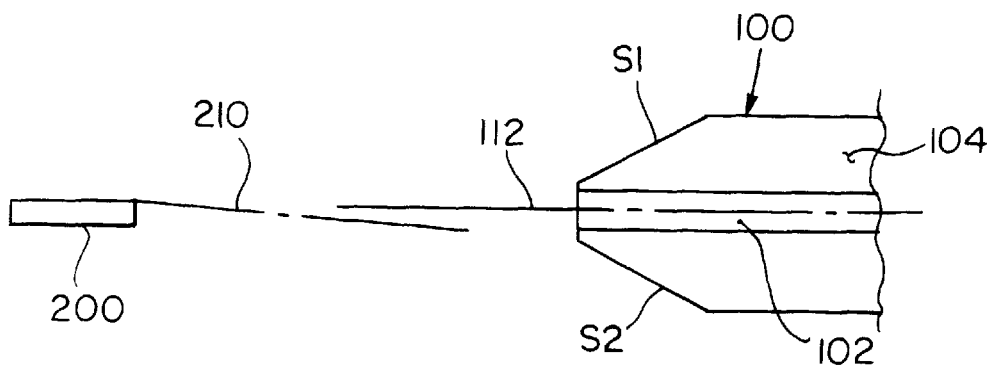
FIG. 3 is a side view illustrating the coupling between the laser and the fiber when the optical axis of the laser is not parallel to the optical axis of the fiber.

As illustrated by FIG. 3, angles θ1 and θ2 of surfaces S1 and S2 need not be equal to each other. This might be necessary when the optical axis 210 of the light source 200 is not parallel to the optic axis of the fiber as illustrated. This is equivalent to having a tilted facet or laser beam.

The present invention is not limited to elliptical core fibers or circularly symmetric fibers. It can be used with elliptical clad, panda, elliptical core, bow-tie, tapered, and circularly symmetric fibers. Moreover, more than two angled surfaces may be formed at the tip 110 to achieve a more hyperbolic end, while still maintaining the perpendicular end surface S3. Still further, the fiber tip may have a dielectric coating.

Figure 4A:
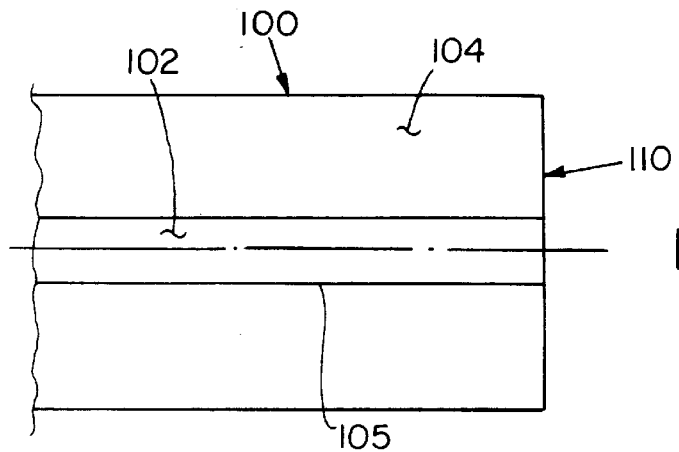
FIGS. 4A–4C illustrate the steps for manufacturing the inventive fiber tip.
Figure 4B:
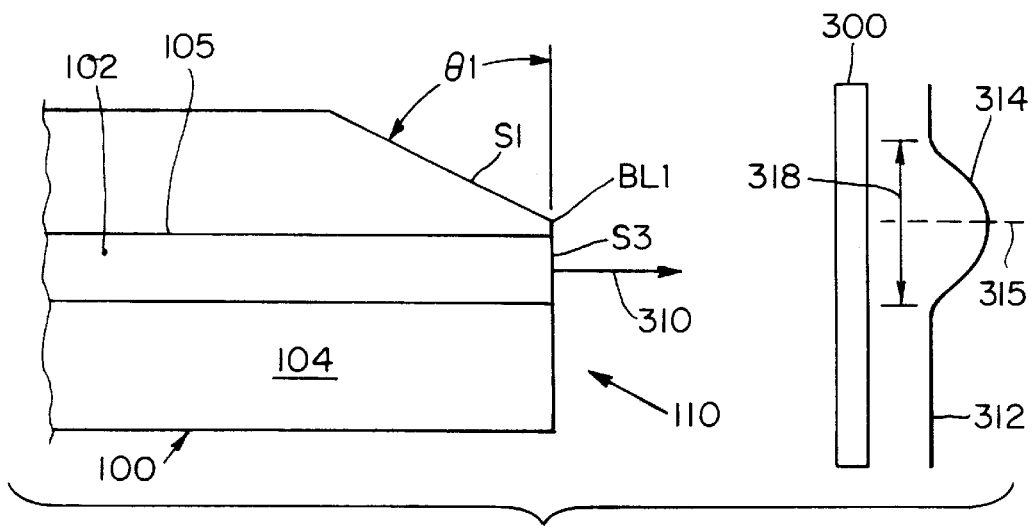
Figure 4C:
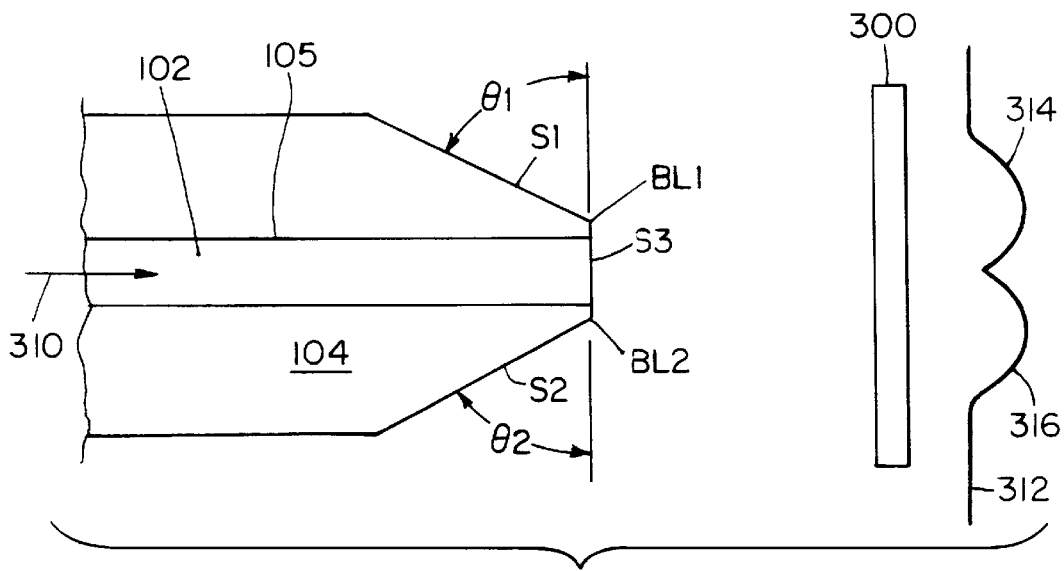

FIGS. 4A–4C illustrate the technique for manufacturing the inventive fiber tip.

As shown in FIG. 4A, the end 110 of the fiber 100 is flat cleaved. This step is preferably performed using well-known fiber cleaving processes.

As shown in FIG. 4B, the surface S1 is then polished into the fiber. The extent of the polishing and thus the extent of surface S1 is controlled in response to a pattern of light 310 exiting the fiber, which is produced by injecting light into the opposite end. An intensity profile 312 is monitored using photodetector 300. In the preferred embodiment, the photodetector is located remotely from and parallel to surface S3. The intensity is scanned in a direction perpendicular to break-line BL1 in the plane of the photodetector 300 to plot the spatial intensity profile 312.

The shape and location of the peak 314 in the spatial intensity profile is used to control the polishing of the surface. Generally, the location of the peak's maxima 315 in a direction parallel to surface S3 is indicative of the location of the break-line BL1, and the peak's shape or extent 318 is indicative of the angle θ1. Thus, the profile is descriptive of the two variables in the machining of surface S1.

Generally, the polishing of surface S1 is controlled so that the location of the breakline BL1 either falls only over the cladding 104 or in some cases may also enter a portion of the core 102. This choice depends generally on the frequency of light transmitted by the fiber relative to the fiber's dimensions and thus to what extent the light is transmitted within the fiber's cladding 104.

As shown in FIG. 4C, in the next step, surface S2 is polished into the fiber tip. Again, the spatial intensity profile 312 on the detector 300 is used to monitor polishing to achieve the desired location of break-line BL2 and angle θ2 by reference to the maxima and breadth of peak 316.

Experience from manufacturing suggests that it is helpful to allow the fiber 100 to bend somewhat during the polishing process. It is theorized that this adds some curvature to surfaces S1 and S2 and rounds over the break-lines BL1 and BL2 achieving a more hyperbolic cross-section.

In other embodiments, additional, i.e., more than two, angled surfaces, such as a total of four, are polished into the fiber tip. While increasing polishing steps, the tip better approximates a circularly hyperbolic shape.

There are a number of advantages of the present invention relative to the double-angled wedge-shaped fiber tip. First, the number of independent variables in the manufacture of the fiber is reduced to four, the location of the break-lines and the angles of surfaces S1 and S2. There are seven independent variables in the manufacture of the double-angled wedge-shaped angle tip. Additionally, the cleaved surface S3 is not subjected to polishing and therefore retains the superior optical properties of a smooth, cleaved surface relative to a polished surface.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A method for manufacturing a tip for an optical fiber including a core and surrounding cladding for transmitting electromagnetic radiation along an axis of the fiber, the process comprising:

cleaving an end surface in the fiber;

polishing a first angled surface, which defines a first break-line at an intersection between the first angled surface and the end surface, until the break-line falls near an edge of the core; and polishing a second angled surface, which defines a second break-line at an intersection between the second angled surface and the end surface, until the second break-line falls near the edge of the core, wherein the tip is installed in proximity to a semiconductor laser source to collect light therefrom.

2. The method described in claim 1, further comprising:

detecting a spatial intensity profile of light exiting from the tip; and using the spatial intensity profile to monitor the polishing of the first and/or second angled surfaces.

3. The method described in claim 1, wherein the fiber is cleaved so that the end surface is substantially orthogonal to an axis of the fiber.

4. The method described in claim 1, further comprising polishing the first and second angled surfaces at different angles relative to an axis of the fiber.

5. The method described in claim 1, further comprising polishing the first and second angled surfaces at the same angle relative to an axis of the fiber.

6. A method for manufacturing a tip for an optical fiber including a core and surrounding cladding for transmitting electromagnetic radiation along an axis of the fiber, the process comprising:

cleaving an end surface in the fiber;

thereafter polishing a first angled surface, which defines a first break-line at an intersection between the first angled surface and the end surface, until the break-line falls near an edge of the core; and thereafter polishing a second angled surface, which defines a second break-line at an intersection between the second angled surface and the end surface, until the second break-line falls near the edge of the core, wherein the tip is installed in proximity to a semiconductor laser source to collect light therefrom.

7. The method described in claim 6, further comprising:

detecting a spatial intensity profile of light exiting from the tip; and using the spatial intensity profile to monitor the polishing of the first and/or second angled surfaces.

8. The method described in claim 6, wherein the fiber is cleaved so that the end surface is substantially orthogonal to an axis of the fiber.

9. The method described in claim 6, further comprising polishing the first and second angled surfaces at different angles relative to an axis of the fiber.

10. The method described in claim 6, further comprising polishing the first and second angled surfaces at the same angle relative to an axis of the fiber.

11. The method described in claim 6, further comprising polishing the first and second angled surfaces at the same angle relative to an axis of the fiber.

* * * * *